US009287231B2

(12) United States Patent
Chen

(10) Patent No.: US 9,287,231 B2
(45) Date of Patent: Mar. 15, 2016

(54) PACKAGE STRUCTURE WITH DIRECT BOND COPPER SUBSTRATE

(71) Applicant: Delta Electronics Int'l (Singapore) Pte Ltd, Singapore (SG)

(72) Inventor: Da-Jung Chen, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 32 days.

(21) Appl. No.: 14/258,778

(22) Filed: Apr. 22, 2014

(65) Prior Publication Data

US 2015/0303164 A1    Oct. 22, 2015

(30) Foreign Application Priority Data

Apr. 17, 2014 (SG) .......................... 10201401622R

(51) Int. Cl.
| | |
|---|---|
| H01L 23/00 | (2006.01) |
| H01L 23/15 | (2006.01) |
| H01L 23/373 | (2006.01) |
| H01L 23/498 | (2006.01) |
| H01L 23/538 | (2006.01) |
| H01L 23/36 | (2006.01) |

(52) U.S. Cl.
CPC ............ *H01L 24/32* (2013.01); *H01L 23/3735* (2013.01); *H01L 23/49811* (2013.01); *H01L 23/5383* (2013.01); *H01L 23/5389* (2013.01); *H01L 24/09* (2013.01); *H01L 24/33* (2013.01); *H01L 23/36* (2013.01); *H01L 2224/0951* (2013.01); *H01L 2224/29147* (2013.01); *H01L 2224/33055* (2013.01); *H01L 2924/13091* (2013.01); *H01L 2924/181* (2013.01)

(58) Field of Classification Search
CPC ......... H01L 24/32; H01L 24/33; H01L 24/09; H01L 23/5226; H01L 23/15; H01L 23/36
See application file for complete search history.

(56) References Cited

U.S. PATENT DOCUMENTS

| | | | |
|---|---|---|---|
| 7,705,436 | B2 | 4/2010 | Mahler et al. |
| 7,800,908 | B2 | 9/2010 | Schulz-Harder et al. |
| 7,982,304 | B2 | 7/2011 | Lu et al. |
| 8,237,259 | B2 | 8/2012 | Pressel et al. |
| 8,247,891 | B2 | 8/2012 | Wen et al. |

(Continued)

FOREIGN PATENT DOCUMENTS

| | | |
|---|---|---|
| CN | 101197334 | 6/2008 |
| DE | 102007041675 | 2/2009 |

*Primary Examiner* — Mamadou Diallo
(74) *Attorney, Agent, or Firm* — Kirton McConkie; Evan R. Witt

(57) ABSTRACT

A package structure includes a first insulation layer, a first conductive layer, a direct bond copper substrate, and a first electronic component. A first conductive via is formed in the first insulation layer. The first conductive layer is disposed on a top surface of the first insulation layer and in contact with the first conductive via. The direct bond copper substrate includes a second conductive layer, a third conductive layer and a ceramic base. The ceramic base is disposed on a bottom surface of the first insulation layer and exposed to the first insulation layer by press-fit operation. The first electronic component is embedded within the first insulation layer and disposed on the second conductive layer. The first electronic component includes a first conducting terminal. The first conducting terminal is electrically connected with the second conductive layer and/or electrically connected with the first conductive layer through the first conductive via.

20 Claims, 11 Drawing Sheets

(56) References Cited

U.S. PATENT DOCUMENTS

| | | |
|---|---|---|
| 8,446,726 B2 | 5/2013 | Schloerke et al. |
| 8,587,116 B2 | 11/2013 | Hohlfeld et al. |
| 2010/0127383 A1* | 5/2010 | Oka et al. ............ 257/692 |
| 2010/0290490 A1 | 11/2010 | Hammel et al. |
| 2013/0161801 A1 | 6/2013 | Otremba et al. |
| 2013/0256856 A1 | 10/2013 | Mahler et al. |

* cited by examiner

PACKAGE STRUCTURE WITH DIRECT BOND COPPER SUBSTRATE

FIELD OF THE INVENTION

The present invention relates to a package structure, and more particularly to a package structure with a direct bond copper (DBC) substrate partially embedded within an insulation layer.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, several electronic components are integrated into a single circuit module. For example, a power module is one of the widely-used circuit modules. The power module may be applied to an inverter, a converter, an electric vehicle (EV) or a hybrid electric vehicle (HEV). After the electronic components (e.g. capacitors, resistors, inductors, transformers, diodes and transistors) are integrated as a power module, the power module may be installed on a motherboard or a system circuit board.

Conventionally, the package structure for the power module is a housing package structure. That is, a direct bond copper (DBC) substrate that has good heat-dissipating efficacy and withstand higher voltage is used as a substrate. Moreover, several power semiconductor bare chips, passive components and pins are located at a first side of the DBC substrate. Through the pins, the package structure may be connected with an external device or an external component. The power semiconductor bare chips, the passive components and the pins are mounted on the DBC substrate through solder paste. Moreover, the power semiconductor bare chips may be connected with the external device or the external component through aluminum wires, gold wires, copper wires, ribbon bonds or copper clippers. Moreover, the first side of the DBC substrate is covered with a plastic housing. After plastic housing is fixed on the DBC substrate through adhesive or glue, silicone gel is injected into the space between the plastic housing and the DBC substrate in order to protect the power semiconductor bare chips and provide an insulating function. After the silicone gel is solidified, the plastic housing is covered by a top cover. Meanwhile, the procedure of fabricating the housing package structure is completed.

Although the DBC substrate may provide good heat-dissipating efficacy and withstand higher voltage, the conventional housing package structure still has some drawbacks. For example, in the conventional housing package structure, the power semiconductor bare chips, the passive components or other electronic components are only permitted to be mounted on a first side of the DBC substrate. In other words, these electronic components are only mounted on the DBC substrate in a 2D configuration. Moreover, since the electronic components are arranged on the same layer of the DBC substrate, the traces between the electronic components are still long. Under this circumstance, the line impedance is high, and a parasitic effect is easily generated. In other words, the electrical properties are possibly unsatisfied. Moreover, the power module with the conventional housing package structure is installed on a motherboard or a system circuit board by inserts or screws. In other words, the conventional housing package structure is not fixed on the motherboard or the system circuit board by a reflowing process. Consequently, the applications of the conventional housing package structure are restricted.

Therefore, there is a need of providing an improved package structure in order to eliminate the above drawbacks.

SUMMARY OF THE INVENTION

The present invention provides a package structure with a direct bond copper (DBC) substrate partially embedded within an insulation layer in order to avoid the parasitic effect and enhance the electrical properties.

The present invention provides a package structure for packaging multi-layered electronic components in high density integration by using a surface mount technology.

An aspect of the present invention provides a package structure. The package structure includes a first insulation layer, a first conductive layer, a direct bond copper substrate, and at least one first electronic component. At least one first conductive via is formed in the first insulation layer. The first conductive layer is disposed on a top surface of the first insulation layer and in contact with the at least one first conductive via. The direct bond copper substrate includes a second conductive layer, a third conductive layer and a ceramic base. The ceramic base is disposed on a bottom surface of the first insulation layer and exposed to the first insulation layer by a press-fit operation. The second conductive layer is disposed on a top surface of the ceramic base and embedded within the first insulation layer. The third conductive layer is disposed on a bottom surface of the ceramic base. The at least one first electronic component is embedded within the first insulation layer and attached on the second conductive layer through a fixing material. The at least one first electronic component includes at least one first conducting terminal. The at least one first conducting terminal is electrically connected with the second conductive layer and/or electrically connected with the first conductive layer through the at least one first conductive via.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
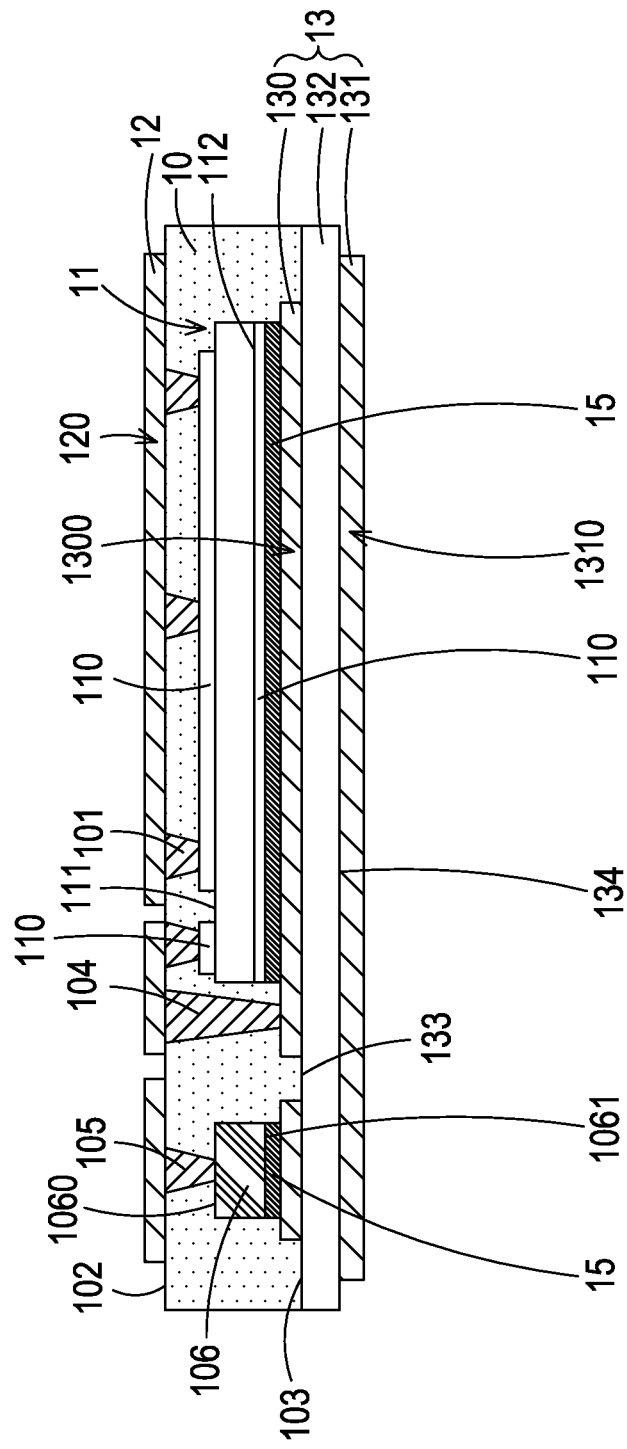
FIG. 1A is a schematic cross-sectional view illustrating a package structure according to a first embodiment of the present invention.

FIG. 1A is a schematic cross-sectional view illustrating a package structure according to a first embodiment of the present invention. The package structure 1 is a surface mount device (SMD) package structure. As shown in FIG. 1A, the package structure 1 includes a first insulation layer 10, at least one first electronic component 11, a first conductive layer 12, and a direct bond copper (DBC) substrate 13.

Moreover, a plurality of first conductive vias 101 are formed in the first insulation layer 10. The first conductive layer 12 is disposed on a top surface 102 of the first insulation layer 10. Moreover, a part of the top surface 102 of the insulation layer 10 is covered by the first conductive layer 12. The first conductive layer 12 is in contact with the first conductive vias 101.

The DBC substrate 13 is partially embedded within the first insulation layer 10. In this embodiment, the DBC substrate 13 includes a second conductive layer 130, a third conductive layer 131, and a ceramic base 132. The ceramic base 132 is disposed on a bottom surface 103 of the first insulation layer 10 and exposed to the first insulation layer 10 by a press-fit operation. The second conductive layer 130 is disposed on a top surface 133 of the ceramic base 132 and embedded within the first insulation layer 10. The third conductive layer 131 is disposed on a bottom surface 134 of the ceramic base 132. Moreover, the third conductive layer 131 is opposed to the second conductive layer 130 with respect to the ceramic base 132 and disposed on a bottom surface 134 of the ceramic base 132.

The first electronic component 11 is embedded within the first insulation layer 10. Moreover, the first electronic component 11 is attached on the second conductive layer 130 through a fixing material 15. Moreover, the first electronic component 11 includes a plurality of first conducting terminals 110. The first conducting terminal 110 on a top surface 111 of the first electronic component 11 is in contact with the corresponding first conductive vias 101. The first conducting terminal 110 on a bottom surface 112 of the first electronic component 11 is in contact with the second conductive layer 130 and connected with the second conductive layer 130.

In an embodiment, the first insulation layer 10 is made of resin or any other appropriate insulation material with high thermal conductivity. The first conductive vias 101 are formed in the first insulation layer 10, and exposed to the top surface 102 of the first insulation layer 10. Moreover, the first conductive vias 101 are in contact with the first conductive layer 12. The method of forming the first conductive vias 101 is well known to those skilled in the art. For example, after several vias are formed in the first insulation layer 10 by a laser drilling process, a mechanical drilling process or a photolithography process and a conductive material is formed in the vias by a filling process or an electroplating process, the first conductive vias 101 are formed.

Moreover, by etching the first conductive layer 12, the second conductive layer 130 and the third conductive layer 131, one or more separate first conductive patterns 120, one or more separate second conductive patterns 1300 and one or more separate third conductive patterns 1310 are formed. In this embodiment as shown in FIG. 1A, the first conductive layer 12 includes three separate first conductive patterns 120, the second conductive layer 130 includes two separate second conductive patterns 1300, and the third conductive layer 131 includes one third conductive pattern 1310. The first conductive patterns 120 are in contact with the corresponding first conductive vias 101. The first electronic component 11 is disposed on the corresponding second conductive pattern 1300 and the corresponding first conducting terminal 110 of the first electronic component 11 is in contact with the corresponding second conductive pattern 1300.

Moreover, the first conductive layer 12, the second conductive layer 130 and the third conductive layer 131 are made of copper or any other appropriate conductive material. For example, after the conductive material is electroplated or deposited on the top surface 101 of the first insulation layer 10, the top surface 133 of the ceramic base 132 and the bottom surface 134 of the ceramic base 132, the first conductive layer 12, the second conductive layer 130 and the third conductive layer 131 are respectively formed. The first conductive patterns 120 and the third conductive patterns 1310 may be served as contact pads of the package structure 1. Consequently, the package structure 1 may be mounted on a system circuit board (not shown) by a surface mount technology.

An example of the fixing material 15 includes but is not limited to a silver sintering material, a silver adhesive epoxy material, solder paste, an adhesive or a silver diffusion soldering material. The silver sintering material and the silver diffusion soldering material with a higher moisture sensitivity level (MSL) are preferred fixing materials because they have longer lives.

The first electronic component 11 is an active component or a passive component. An example of the first electronic component 11 includes but is not limited to an integrated circuit chip, an integrated power component, a metal-oxide-semiconductor field-effect transistor (MOSFET), an insulated-gate bipolar transistor (IGBT), a diode, a capacitor, a resistor, an inductor or a fuse.

In some embodiments, the package structure 1 further includes at least one second conductive via 104. The second conductive via 104 is formed in the first insulation layer 10. A first end of the second conductive via 104 is in contact with the corresponding first conductive pattern 120. A second end of the second conductive via 104 is in contact with the corresponding second conductive pattern 1300. After the heat generated by the first electronic component 11 is transferred to the second conductive layer 130, a portion of the heat may be transferred to the first conductive layer 12 through the second conductive via 104. Consequently, the heat dissipating efficacy is increased. Moreover, the first conductive layer 12 and the second conductive layer 130 are electrically contacted with each other through the second conductive via 104. When the first conducting terminal 110 is disposed on the second conductive layer 130, the first conducting terminal 110 is electrically connected with the first conductive layer 12 through the second conductive layer 130 and the second conductive via 104. Consequently, the first conductive patterns 120 are served as the contact pads of the package structure 1. After the package structure 1 is mounted on a system circuit board (not shown) by a surface mount technology, the first conducting terminals 110 of the first electronic component 11 are electrically connected with the electronic components (not shown) or traces (not shown) of the system circuit board through the corresponding second conductive pattern 1300, the second conductive via 104 and the corresponding first conductive pattern 120. The method of forming the second conductive via 104 is similar to the method of forming the first conductive vias 101, and is not redundantly described herein.

In this embodiment, the first electronic component 11 is an insulated-gate bipolar transistor (IGBT). That is, the first electronic component 11 has three first conducting terminals 110. The three first conducting terminals 110 include a gate terminal, a collector terminal and an emitter terminal. As shown in FIG. 1A, two of the gate terminal, the collector terminal and the emitter terminal are formed on the top surface 111 of the first electronic component 11, and the other one of the gate terminal, the collector terminal and the emitter terminal is formed on the bottom surface 112 of the first electronic component 11.

In an embodiment, the length of the third conductive layer 131 in a horizontal direction is shorter than the length of the ceramic base 132 in the horizontal direction. Moreover, the third conductive layer 131 is located at a substantially middle region of the bottom surface 134 of the ceramic base 132. Consequently, the creepage distance between the third conductive layer 131 and the first conductive layer 12 along the outer side of the package structure 1 is increased.

For allowing the first conductive layer 12 and the second conductive layer 130 to be electrically connected with each other, the first end of the second conductive via 104 is in contact with the corresponding first conductive layer 12, and the second end of the second conductive via 104 is in contact with the second conductive layer 130. Since the second conductive via 104 is formed in the first insulation layer 10 by a laser drilling process, a mechanical drilling process or a photolithography process, the second conductive via 104 needs to be deep enough. In other words, the process of forming the second conductive via 104 is time-consuming and labor-intensive, and the first insulation layer 10 is possibly destroyed. For solving these drawbacks, the first insulation layer 10 further includes a third conductive via 105 and a conducting structure 106. A first end of the third conductive via 105 is in contact with the first conductive layer 12. A second end of the third conductive via 105 is in contact with a top surface 1060 of the conducting structure 106. A bottom surface 1061 of the conducting structure 106 is disposed on the second conductive layer 130 through the fixing material 15. The conductive structure 106 is made of a metallic material. An example of the conducting structure 106 includes but is not limited to a copper stud. Under this circumstance, the second conductive via 104 may be replaced by the combination of the third conductive via 105 and the conducting structure 106. That is, through the combination of the third conductive via 105 and the conducting structure 106, the first conductive layer 12 and the second conductive layer 130 are electrically connected with each other. Since the depth of the third conductive via 105 is smaller than the depth of the second conductive via 104, the process of forming the third conductive via 105 is simplified and time-saving, and the possibility of destroying the first insulation layer 10 is minimized. The method of forming the third conductive via 105 is similar to the method of forming the first conductive vias 101, and is not redundantly described herein.

As mentioned above, the first conducting terminals 110 of the first electronic component 11 are electrically connected with the corresponding second conductive pattern 1300 and/or electrically connected with the corresponding first conductive patterns 120 through the corresponding first conductive vias 101. Consequently, the heat generated by the first electronic component 11 may be transferred to the surroundings of the package structure 1 through the electric path and the thermal conduction path of the first conducting terminals 110 of the first electronic component 11, the corresponding first conductive vias 101, the corresponding first conductive patterns 120 and the corresponding second conductive pattern 1300. Moreover, the ceramic base 132 is arranged between the second conductive layer 130 and the third conductive layer 131 and has the heat conducting function. Consequently, after the heat generated by the first electronic component 11 is transferred to the second conductive layer 130, the heat is transferred to the third conductive layer 131 through the ceramic base 132. In other words, the heat generated by the first electronic component 11 may be vertically and bilaterally dissipated to the surroundings of the package structure 1 through the corresponding first conductive patterns 120 and the corresponding third conductive pattern 1310. Moreover, since the first electronic component 11 is embedded within the first insulation layer 10 and the first conducting terminals 110 of the first electronic component 11 are electrically connected with the corresponding first conductive patterns 120 through the first conductive vias 101 and/or electrically connected with the corresponding second conductive patterns 1300 by directly disposing the first conducting terminals 110 of the first electronic component 11 on the corresponding second conductive patterns 1300, it is not necessary to use the wire bonding process to connect the first electronic component 11 with the corresponding first conductive patterns 120 and/or the corresponding second conductive patterns 1300. Consequently, the complexity of manufacturing process and the fabricating cost of the package structure 1 are reduced. Moreover, the first conductive patterns 120 may be served as contact pads of the package structure 1. Since the package structure 1 is mounted on a system circuit board (not shown) by a surface mount technology, the applications of the package structure 1 are wider when compared with the conventional technology of using inserts or screws to installed the package structure on a motherboard or a system circuit board.

Figure 1B:
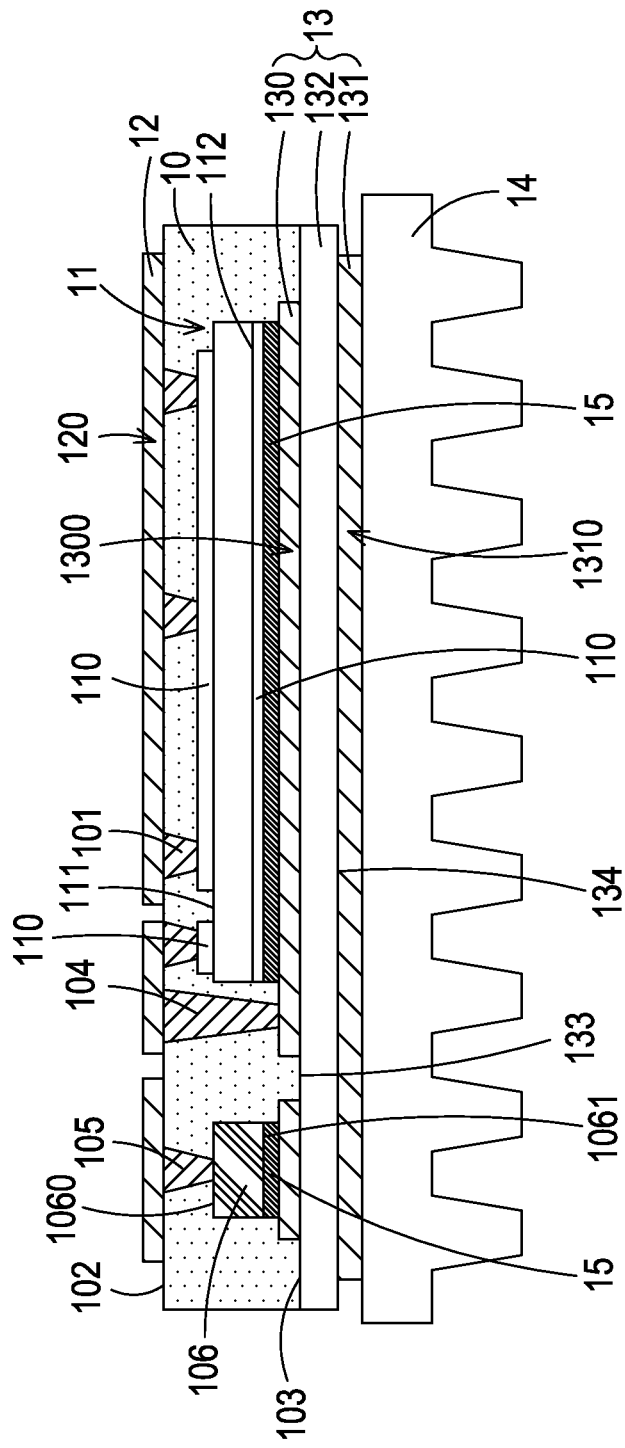
FIG. 1B is a schematic cross-sectional view illustrating another package structure of FIG. 1A.

Alternatively, in some embodiments, for enhancing the heat dissipating efficacy of the package structure 1 of FIG. 1A, the package structure 1 further includes a first heat dissipation device 14 as shown in FIG. 1B. The first heat dissipation device 14 is arranged beside the third conductive layer 131 and located at an outer side of the package structure 1. Consequently, when the heat generated by the first electronic component 11 is transferred downwardly to the surroundings of the package structure 1 through the third conductive layer 131, the heat dissipating efficacy of the third conductive layer 13 is enhanced by the first heat dissipation device 14.

In some embodiments, the first heat dissipation device 14 may be a passive heat dissipation device or an active heat dissipation device. An example of the passive heat dissipation device includes but is not limited to a heat sink made of metallic material or ceramic material. An example of the active heat dissipation device includes but is not limited to cooling water or heat pipe.

It is noted that numerous modifications and alterations of the package structure 1 of FIG. 1B may be made while retaining the teachings of the invention. Hereinafter, some variant examples of the package structure 1 will be illustrated with reference to FIGS. 2-10. Component parts and elements corresponding to those of the first embodiment are designated by identical numeral references, and detailed descriptions thereof are omitted.

Figure 2:
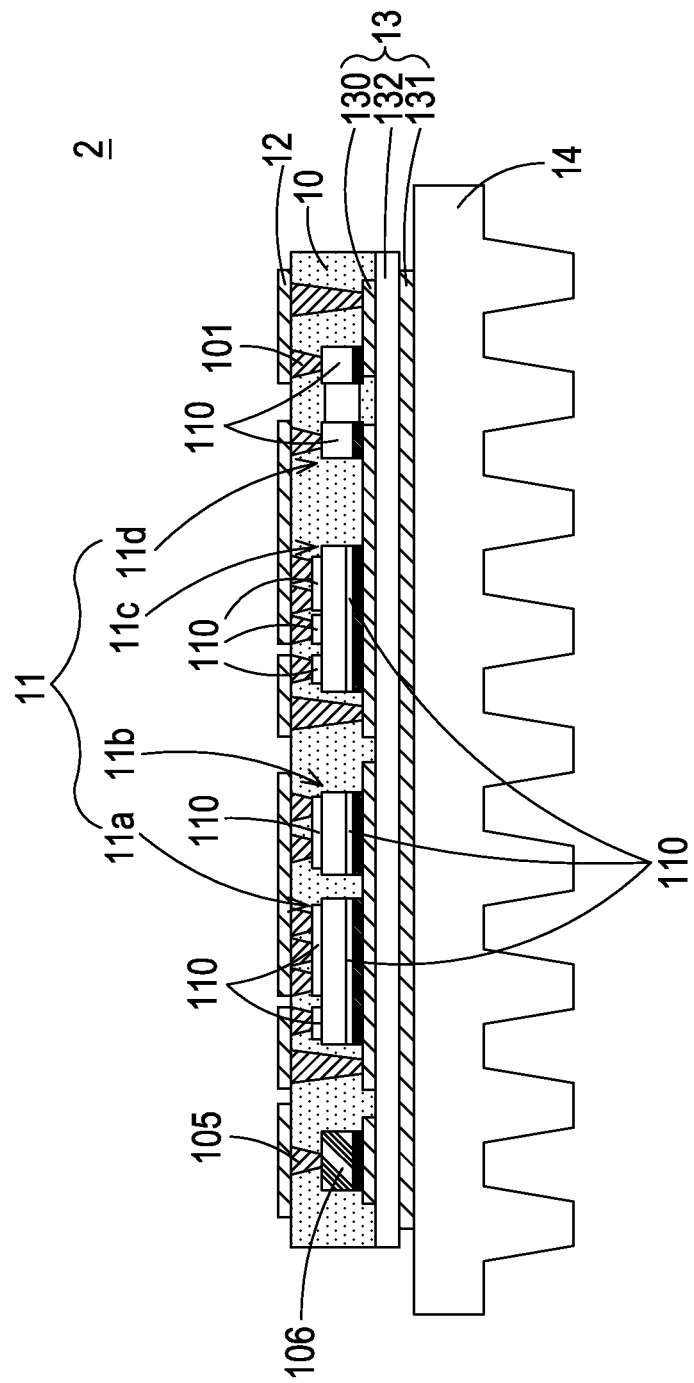
FIG. 2 is a schematic cross-sectional view illustrating a package structure according to a second embodiment of the present invention.

FIG. 2 is a schematic cross-sectional view illustrating a package structure according to a second embodiment of the present invention. In comparison with the first embodiment shown in FIG. 1B, the package structure 2 of this embodiment includes a plurality of first electronic components 11, which are identical or different. For example, as shown in FIG. 2, the package structure 2 includes four first electronic components 11a, 11b, 11c and 11d. The number of the first conducting terminals 110 of each first electronic component 11 is determined according to the type of the first electronic component 11. For example, the first electronic component 11a is an insulated-gate bipolar transistor (IGBT) with three first conducting terminals 110. Moreover, each of the first electronic components 11b and 11d has two first conducting terminals 110. For example, the first electronic component 11b is a diode, and the first electronic component 11d is a capacitor or a resistor. In case that the first electronic component 11 is an integrated circuit (IC) chip, the number of the first conducting terminals 110 may be determined according to the configuration of the IC chip. As shown in FIG. 2, the first electronic component 11c is an IC chip with a plurality of first conducting terminals 110, for example four first conducting terminals 110. It is noted that the number of the first electronic components 11 within the package structure 2 may be varied according to the practical requirements.

Figure 3:
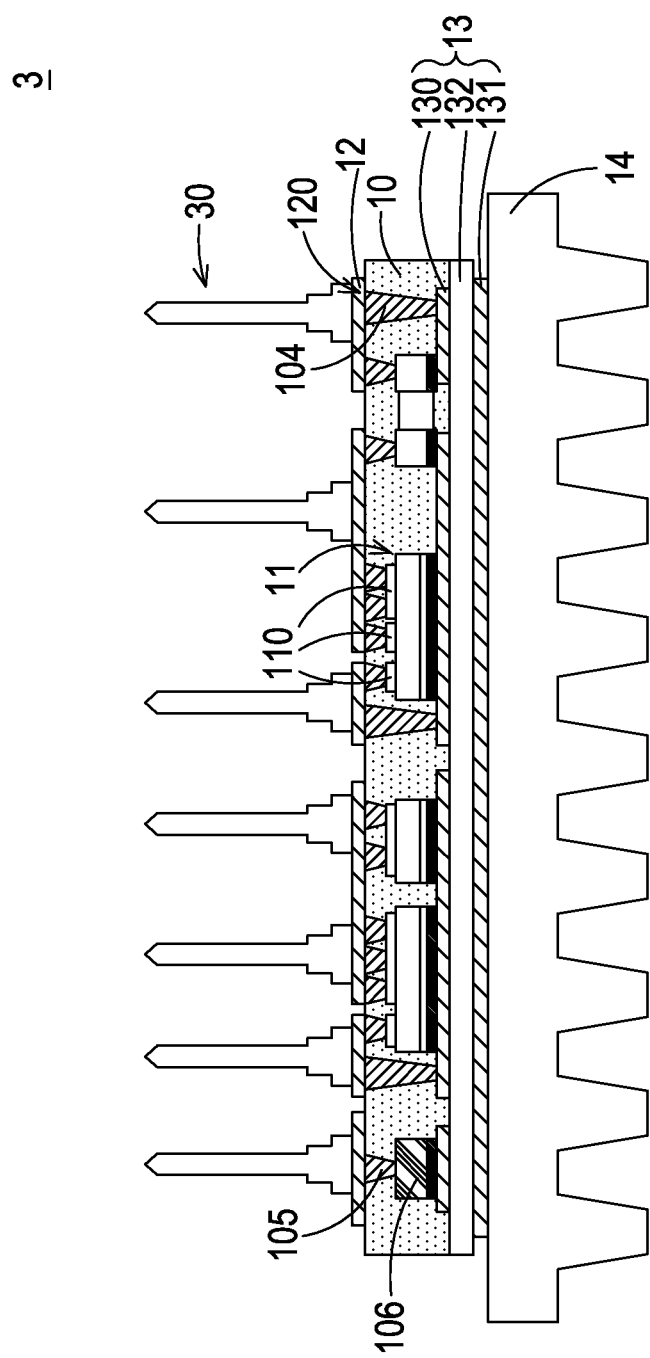
FIG. 3 is a schematic cross-sectional view illustrating a package structure according to a third embodiment of the present invention.

FIG. 3 is a schematic cross-sectional view illustrating a package structure according to a third embodiment of the present invention. In comparison with the second embodiment shown in FIG. 2, the package structure 3 of this embodiment further includes at least one pin 30, which is made of a metallic material. The at least one pin 30 is disposed on and in contact with the corresponding first conductive pattern 120 of the first conductive layer 12 by a solder paste welding process, a ultrasonic welding process, a hot pressure welding process, an electric welding process or a mechanical embedding process. Through the pin 30, the package structure 3 may be welded on a system circuit board (not shown). Alternatively, after the at least one pin 30 is inserted into corresponding hole of the system circuit board, the package structure 3 is fixed on the system circuit board by a manual welding process or a wave soldering process.

Figure 4:
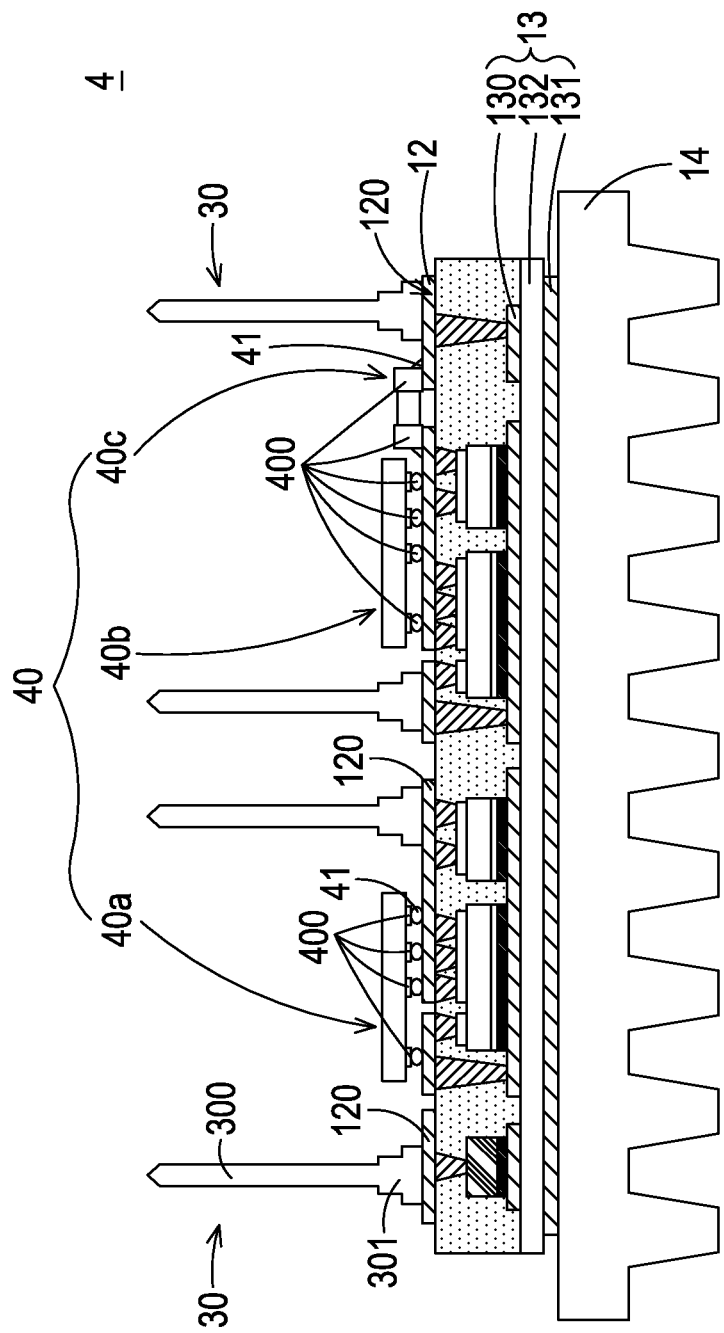
FIG. 4 is a schematic cross-sectional view illustrating a package structure according to a fourth embodiment of the present invention.

FIG. 4 is a schematic cross-sectional view illustrating a package structure according to a fourth embodiment of the present invention. In comparison with the third embodiment shown in FIG. 3, the package structure 4 of this embodiment further includes at least one second electronic component 40. The at least one second electronic component 40 is disposed on the first conductive layer 12, and arranged between the pins 30. Moreover, the second electronic component 40 includes at least one second conducting terminal 400. The second conducting terminal 400 is disposed on the corresponding first conductive pattern 120. Moreover, the second conducting terminal 400 is fixed on the corresponding first conductive pattern 120 through solder paste 41. Consequently, the power density of the package structure 4 is enhanced. Moreover, since the second electronic component 40 is installed on an outer surface of the package structure 4, the fabricating cost is reduced, and the flexibility of selecting the electronic component is enhanced.

In this embodiment, the pin 30 includes an insertion part 300 and a sustaining part 301. The insertion part 300 is an elongated leg to be inserted into a system circuit board. A first end of the sustaining part 301 is disposed on the corresponding first conductive pattern 120 of the first conductive layer 12. A second end of the sustaining part 301 is connected with the insertion part 300. Moreover, the width of the sustaining part 301 is larger than the width of the insertion part 300. The overall height of the sustaining part 301 with respect to the first conductive layer 12 is larger than the overall height of the second electronic component 40 with respect to the first conductive layer 12. When the insertion part 300 is inserted into a corresponding insertion hole of the system circuit board, the sustaining part 301 is in contact with the surface of the system circuit board, and opposed to the insertion part 300 with respect to the system circuit board. Since the overall height of the sustaining part 301 with respect to the first conductive layer 12 is larger than the overall height of the second electronic component 40 with respect to the first conductive layer 12, during the process of inserting the insertion part 300 with respect to the corresponding insertion hole of the system circuit board, the external force applied on the system circuit board will not suppress the second electronic component 40. In other words, since the sustaining part 301 is in contact with the surface of the system circuit board when the insertion part 300 is inserted into a corresponding insertion hole of the system circuit board, second electronic component 40 can be effectively protected.

Alternatively, the package structure 4 may includes a plurality of second electronic components 40, which are identical or different. For example, as shown in FIG. 4, the package structure 4 includes three second electronic components 40a, 40b and 40c. The number of the second conducting terminals 400 of each second electronic component 40 is determined according to the type of the second electronic component 40. In case that the second electronic component 40a, 40b is an IC chip, the second electronic component 40a, 40b has a plurality of second conducting terminals 400, for example four second conducting terminals 400. In case that the second electronic component 40 is a capacitor, a resistor or a diode, the second electronic component 40 has two second conducting terminals 400. For example, the second electronic component 40c is a resistor. It is noted that the number of the second electronic components 40 within the package structure 4 may be varied according to the practical requirements.

Figure 5:
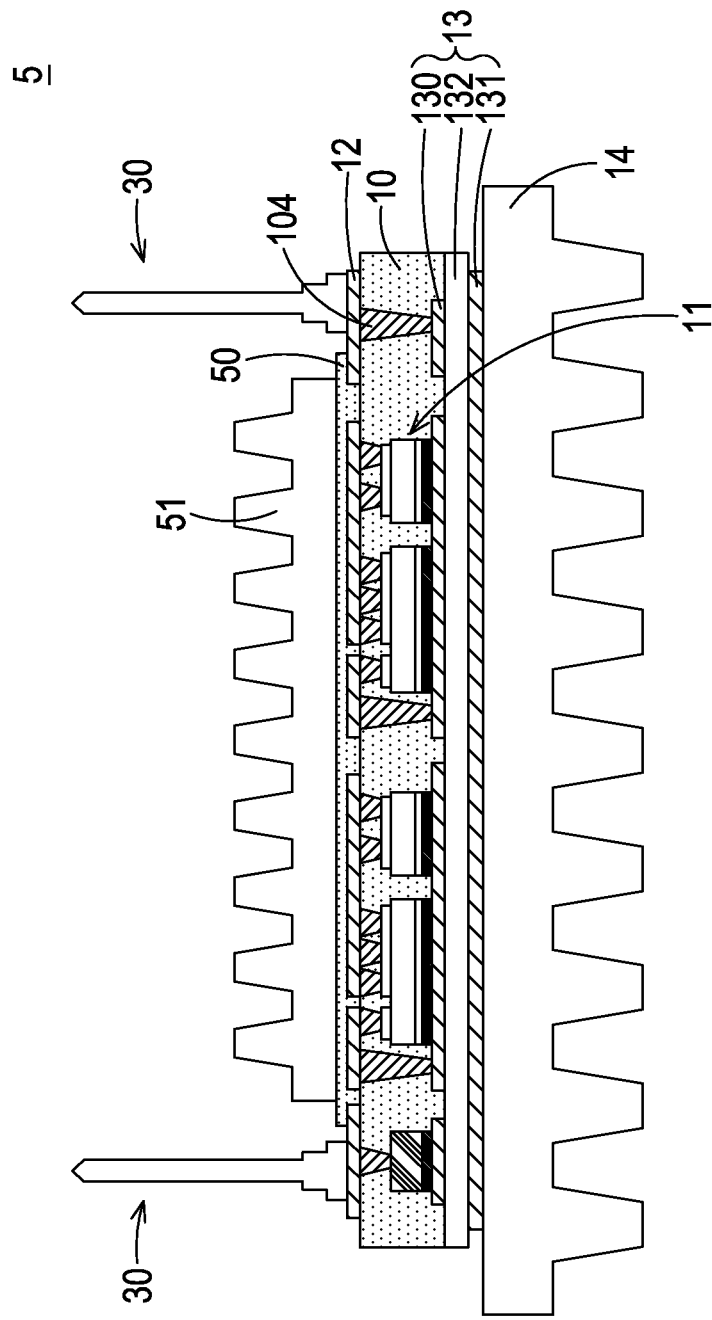
FIG. 5 is a schematic cross-sectional view illustrating a package structure according to a fifth embodiment of the present invention.

FIG. 5 is a schematic cross-sectional view illustrating a package structure according to a fifth embodiment of the present invention. In comparison with the third embodiment shown in FIG. 3, the package structure 5 of this embodiment further includes a first insulative heat-dissipating layer 50 and a second heat dissipation device 51. The first insulative heat-dissipating layer 50 is arranged between the second heat dissipation device 51 and the first conductive layer 12. The second heat dissipation device 51 is located at an outer side of the first insulative heat-dissipating layer 50 for enhancing the heat dissipating efficacy of the first conductive layer 12. In this embodiment, the package structure 5 has a plurality of pins 30. The pins 30 are disposed on and in contact with the corresponding first conductive pattern 120 of the first conductive layer 12 that is exposed outside the first insulative heat-dissipating layer 50. Moreover, the second heat dissipation device 51 is arranged between the pins 30.

Due to the first insulative heat-dissipating layer 50, the first conducting terminals 110 of the first electronic component 11 that are electrically connected with the first conductive layer 12 may be isolated from the second heat dissipation device 51. In addition, the heat generated by the first electronic component 11 may be transferred to the second heat dissipation device 51 through the first insulative heat-dissipating layer 50. Moreover, since the first insulative heat-dissipating layer 50 can prevent the occurrence of current leakage and high-voltage spark, the package structure 5 can withstand a high voltage. The operations of the second heat dissipation device 51 are identical to those of the first heat dissipation device 14, and are not redundantly described herein.

Figure 6:
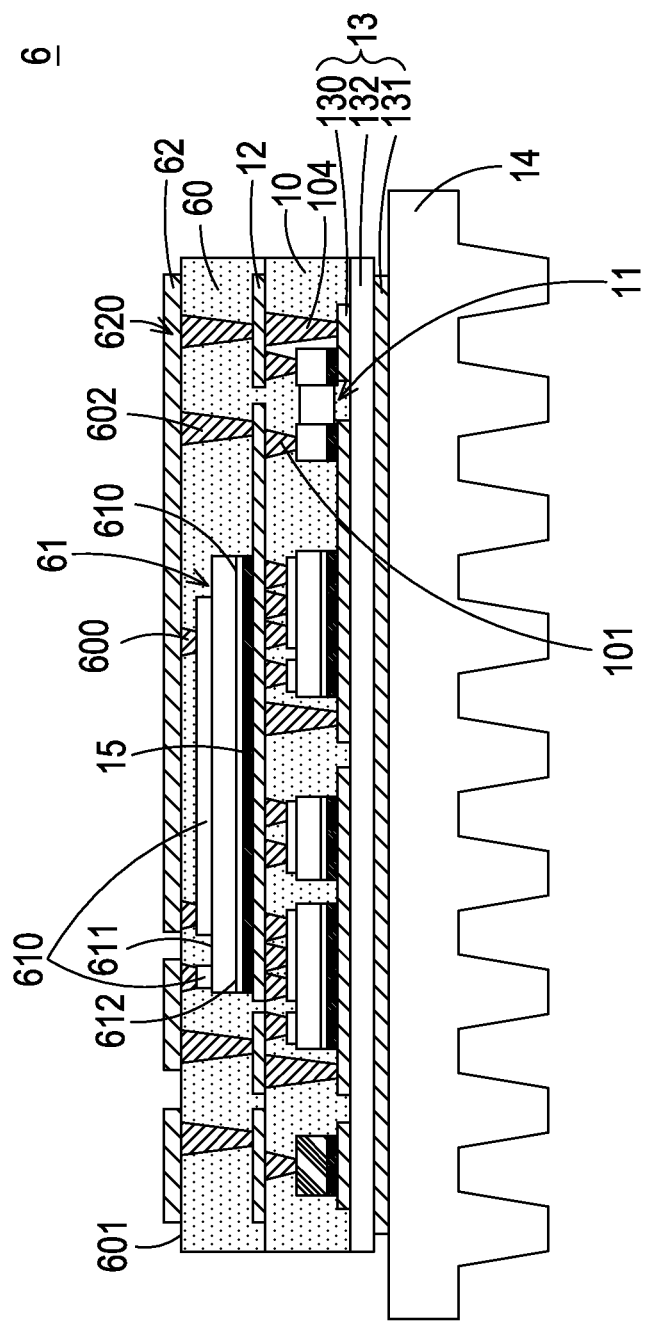
FIG. 6 is a schematic cross-sectional view illustrating a package structure according to a sixth embodiment of the present invention.

FIG. 6 is a schematic cross-sectional view illustrating a package structure according to a sixth embodiment of the present invention. In comparison with the second embodiment shown in FIG. 2, the package structure 6 of this embodiment further includes a second insulation layer 60, a third electronic component 61, and a fourth conductive layer 62. The second insulation layer 60 is disposed on the first conductive layer 12 and covers the first conductive layer 12. Moreover, a plurality of fourth conductive vias 600 are formed in the second insulation layer 60. The fourth conductive layer 62 is disposed on a top surface 601 of the second insulation layer 60. Moreover, a part of the top surface 601 of the second insulation layer 60 is exposed. The fourth conductive layer 62 is in contact with the fourth conductive vias 600. The third electronic component 61 is embedded within the second insulation layer 60. Moreover, the third electronic component 61 is attached on the first conductive layer 12 through the fixing material 15. Moreover, the third electronic component 61 includes a plurality of third conducting terminals 610. The third conducting terminal 610 on a top surface 611 of the third electronic component 61 is in contact with the corresponding fourth conductive via 600. The third conducting terminal 610 on a bottom surface 612 of the third electronic component 61 is directly disposed on the first conductive layer 12, and in contact with the first conductive layer 12. Through the third conducting terminal 610 on the top surface 611 of the third electronic component 61 and the corresponding fourth conductive via 600, the third electronic component 61 is electrically connected with the fourth conductive layer 62. Through the third conducting terminal 610 on the bottom surface 612 of the third electronic component 61, the third electronic component 61 is electrically connected with the first conductive layer 12. Moreover, since the first electronic component 11 is also electrically connected with the first conductive layer 12 and the third electronic component 61 is electrically connected with the first conductive layer 12, the first electronic component 11 is electrically connected with the corresponding third conducting terminal 610 of the third electronic component 61 through the first conductive layer 12.

Moreover, by etching the fourth conductive layer 62, one or more separate fourth conductive patterns 620 are formed. In this embodiment as shown in FIG. 6, the fourth conductive layer 62 includes three separate fourth conductive patterns 620. The fourth conductive patterns 620 are in contact with the corresponding fourth conductive vias 600.

Moreover, the third conducting terminal 610 on the top surface 611 of the third electronic component 61 is connected with the corresponding fourth conductive pattern 620 through the corresponding fourth conductive via 600, and the third conducting terminal 610 on a bottom surface 612 of the third electronic component 61 is directly disposed on the corresponding first conductive pattern 120 and in contact with the corresponding first conductive pattern 120. The fourth conductive patterns 620 may be served as contact pads of the package structure 6. Consequently, the package structure 6 may be mounted on a system circuit board (not shown) by a surface mount technology. After the package structure 6 is mounted on a system circuit board (not shown) by a surface mount technology, the first conducting terminals 110 of the first electronic component 11 and the third conducting terminals 610 of the third electronic component 61 are electrically connected with the electronic components (not shown) or traces (not shown) of the system circuit board through the corresponding fourth conductive patterns 620.

Moreover, since the package structure 6 is a multilayered structure comprising the first insulation layer 10 and the second insulation layer 60, the first electronic component 11 and the third electronic component 61 are embedded within the first insulation layer 10 and the second insulation layer 60, respectively. Since the electronic components are not arranged on the same layer of the DBC substrate, the traces between the electronic components are not too long. Since the first electronic component 11 and the third electronic component 61 are located at different levels with respect to the DBC substrate, the distance between the electronic components (for example the distance between the first electronic component 11 and the third electronic component 61) is effectively shortened. Under this circumstance, the on-resistance is effectively reduced, the parasitic effect is reduced, the electrical property is enhanced, and the overall power density of the package structure 6 is increased.

Moreover, as shown in FIG. 6, at least one fifth conductive via 602 is formed in the second insulation layer 60. A first end of the fifth conductive via 602 is connected with the corresponding fourth conductive pattern 620, and a second end of the fifth conductive via 602 is connected with the corresponding first conductive pattern 120. When the heat generated by the first electronic component 11 is transferred to the first conductive layer 12, the heat may be further transferred to the fourth conductive layer 62 through the fifth conductive via 602. Consequently, the heat dissipating efficacy is enhanced. Moreover, the first conductive layer 12 and the fourth conductive layer 62 are electrically connected with each other through the fifth conductive via 602. In case that the third conducting terminal 610 of the third electronic component 61 is disposed on the portion of the first conductive layer 12 which is in contact with the fifth conductive via 602, the third conducting terminal 610 of the third electronic component 61 may be electrically connected with the fourth conductive layer 62 through the fifth conductive via 602 (see FIG. 6). The method of forming the fifth conductive via 602 is similar to the method of forming the first conductive vias 101, and is not redundantly described herein.

The materials of the first insulation layer 10 and second insulation layer 60 are selected from a group consisting of epoxy resin, plastic material and non-conductive material. The materials of the first insulation layer 10 and second insulation layer 60 are identical or not identical. The first conductive layer 12, the second conductive layer 130, the third conductive layer 131 and the fourth conductive layer 62 are made of copper or any other appropriate conductive material. The materials of the first conductive layer 12, the second conductive layer 130, the third conductive layer 131 and the fourth conductive layer 62 are identical or not identical. Each of the first electronic component 11 and the third electronic component 61 includes but is not limited to an integrated circuit chip, an integrated power component, a metal-oxide-semiconductor field-effect transistor (MOSFET), an insulated-gate bipolar transistor (IGBT), a diode, a capacitor, a resistor, an inductor or a fuse. The first electronic component 11 and the third electronic component 61 may be the same electronic component or different electronic component.

Figure 7:
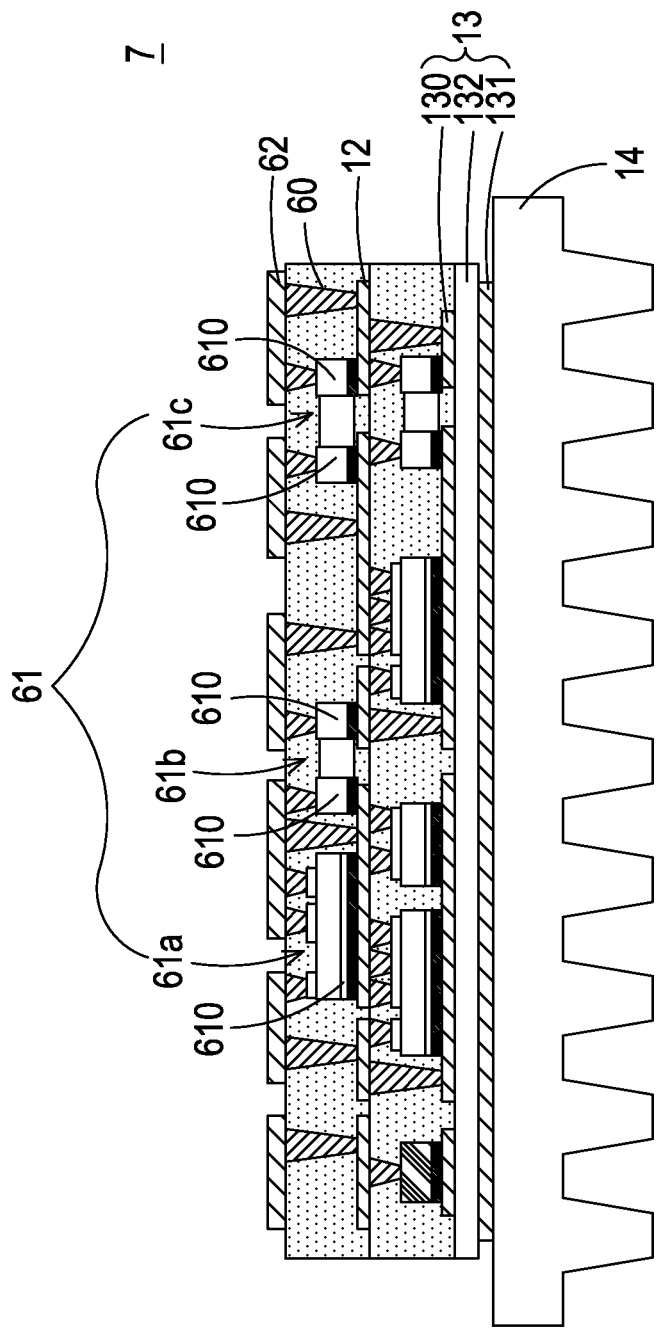
FIG. 7 is a schematic cross-sectional view illustrating a package structure according to a seventh embodiment of the present invention.

FIG. 7 is a schematic cross-sectional view illustrating a package structure according to a seventh embodiment of the present invention. In comparison with the sixth embodiment shown in FIG. 6, the package structure 7 of this embodiment includes a plurality of third electronic components 61, which are identical or different. For example, as shown in FIG. 7, the package structure 7 includes three third electronic components 61a, 61b and 61c. The number of the third conducting terminals 610 of each third electronic component 61 is determined according to the type of the third electronic component 61. In case that the third electronic component 61 is an integrated circuit (IC) chip, the number of the third conducting terminals 610 may be determined according to the configuration of the IC chip. As shown in FIG. 7, the third electronic component 61a is an IC chip with at least one third conducting terminal 610, for example four third conducting terminals 610. In case that the third electronic component 61 is a capacitor, a resistor or a diode, the third electronic component 61 has two third conducting terminals 610. For example, as shown in FIG. 7, the third electronic component 61b is a resistor, and the third electronic component 61c is a resistor.

Figure 8:
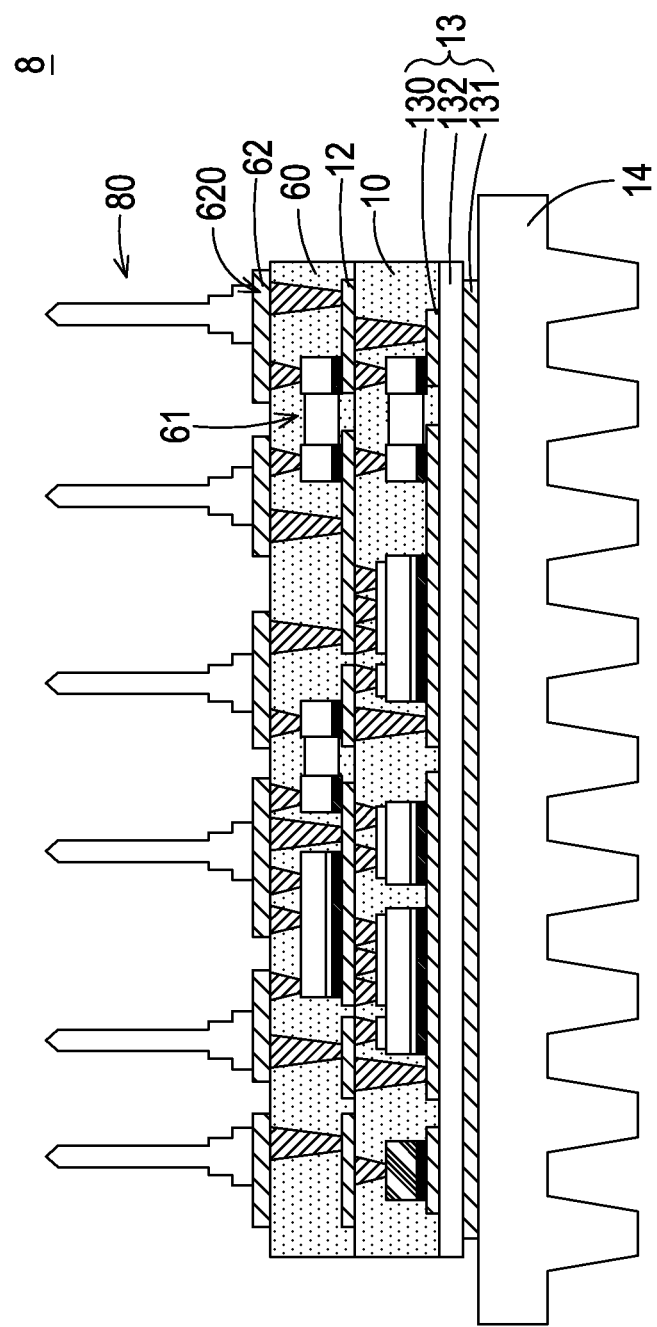
FIG. 8 is a schematic cross-sectional view illustrating a package structure according to an eighth embodiment of the present invention.

FIG. 8 is a schematic cross-sectional view illustrating a package structure according to an eighth embodiment of the present invention. In comparison with the seventh embodiment shown in FIG. 7, the package structure 8 of this embodiment further includes at least one pin 80, which is made of a metallic material. The at least one pin 80 is disposed on and in contact with the corresponding fourth conductive pattern 620 of the fourth conductive layer 62 by a solder paste welding process, a ultrasonic welding process, a hot pressure welding process, an electric welding process or a mechanical embedding process. Through the pin 80, the package structure 8 may be welded on a system circuit board (not shown). Alternatively, after the at least one pin 80 is inserted into corresponding hole of the system circuit board, the package structure 8 is fixed on the system circuit board by a manual welding process or a wave soldering process.

Figure 9:
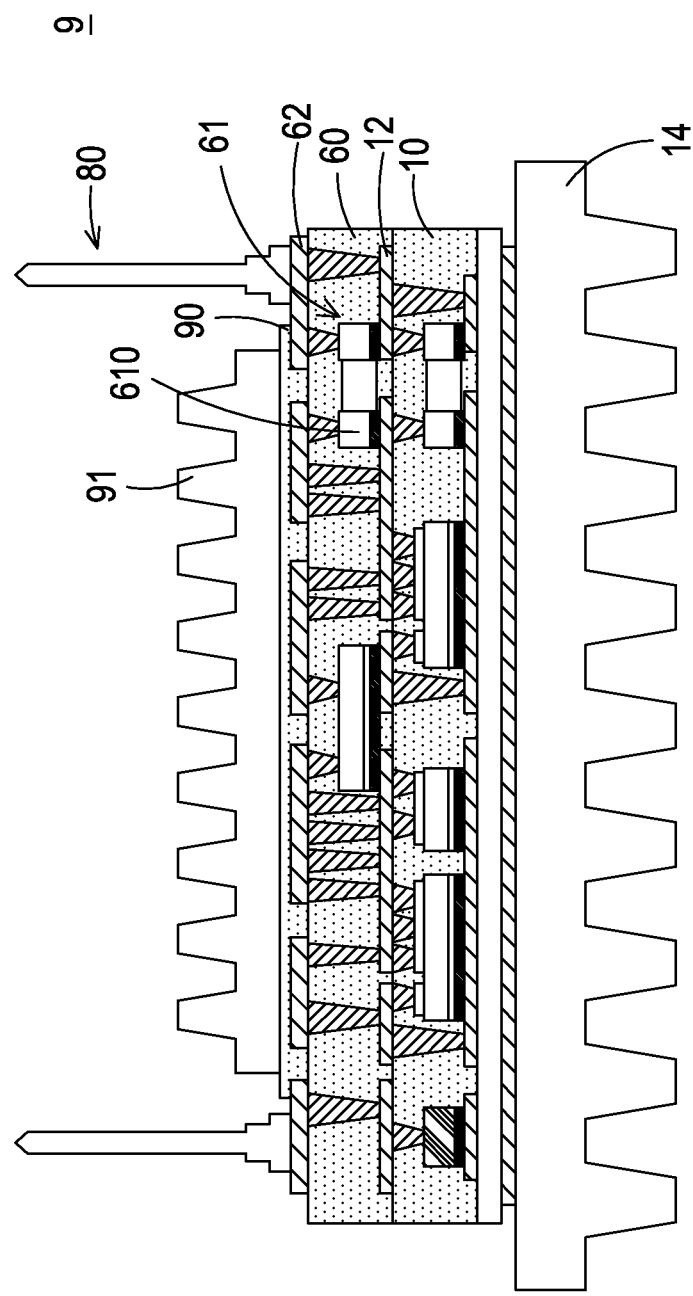
FIG. 9 is a schematic cross-sectional view illustrating a package structure according to a ninth embodiment of the present invention.

FIG. 9 is a schematic cross-sectional view illustrating a package structure according to a ninth embodiment of the present invention. In comparison with the eighth embodiment shown in FIG. 8, the package structure 5 of this embodiment further includes a second insulative heat-dissipating layer 90 and a third heat dissipation device 91. The second insulative heat-dissipating layer 90 is arranged between the third heat dissipation device 91 and the fourth conductive layer 62. The third heat dissipation device 91 is located at an outer side of the second insulative heat-dissipating layer 90 for enhancing the heat dissipating efficacy of the fourth conductive layer 62. In this embodiment, the package structure 9 has a plurality of pins 80. The pins 80 are disposed on and in contact with the corresponding fourth conductive layer 62 that is exposed outside the second insulative heat-dissipating layer 90. Moreover, the third heat dissipation device 91 is arranged between the pins 80.

Due to the second insulative heat-dissipating layer 90, the third conducting terminals 610 of the third electronic component 61 that are electrically connected with the fourth conductive layer 62 may be isolated from the third heat dissipation device 91. Moreover, after the heat is transferred to the fourth conductive layer 62, the heat may be further transferred to the third heat dissipation device 91 through the second insulative heat-dissipating layer 90. Moreover, since the second insulative heat-dissipating layer 90 can prevent the occurrence of current leakage and high-voltage spark, the package structure 9 can withstand a high voltage.

Figure 10:
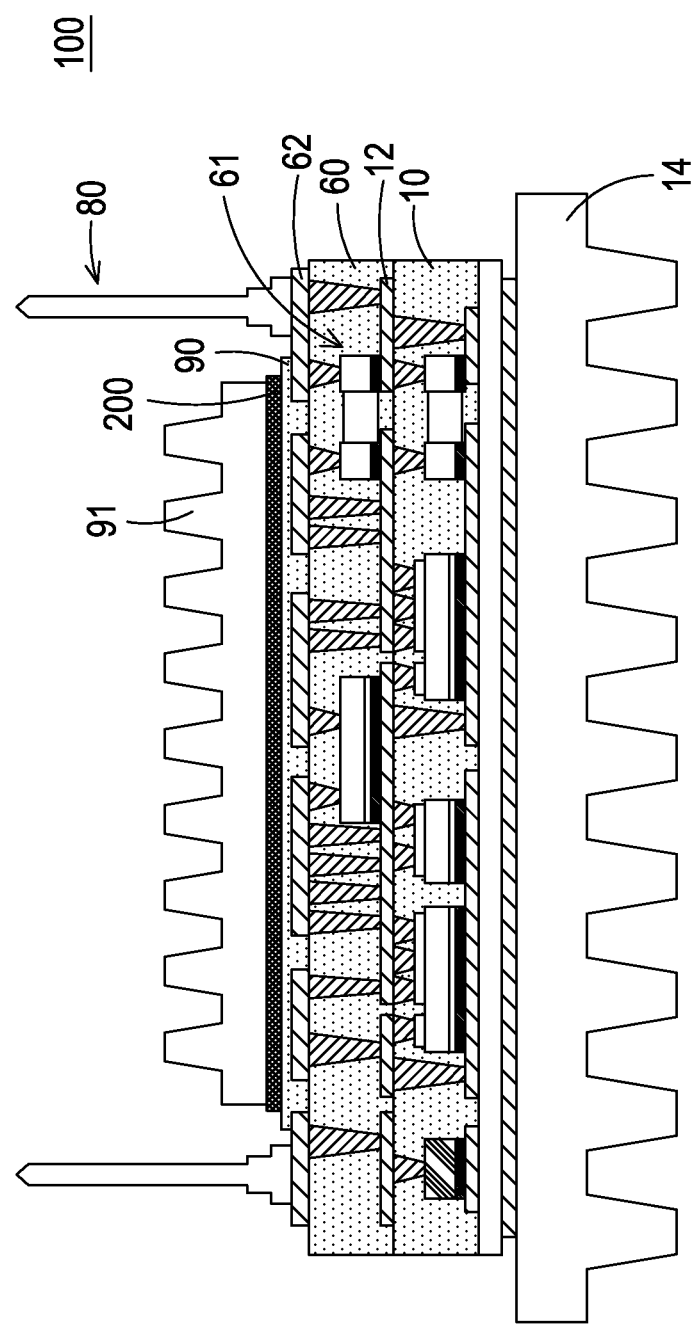
FIG. 10 is a schematic cross-sectional view illustrating a package structure according to a tenth embodiment of the present invention.

FIG. 10 is a schematic cross-sectional view illustrating a package structure according to a tenth embodiment of the present invention. In comparison with the ninth embodiment shown in FIG. 9, the package structure 100 of this embodiment further includes a metal layer 200. The metal layer 200 is arranged between the second insulative heat-dissipating layer 90 and the third heat dissipation device 91. Due to the metal layer 200, the heat from the second insulative heat-dissipating layer 90 can be transferred to the third heat dissipation device 91 more uniformly. Consequently, the heat dissipating efficacy is further increased.

From the above descriptions, the present invention provides a package structure. The package structure includes an insulation layer, a plurality of conductive layers, a direct bond copper substrate, and an electronic component. The direct bond copper substrate is partially embedded within the first insulation layer. The electronic component is also embedded within the insulation layer. Consequently, the heat generated by the electronic component can be transferred downwardly to the surroundings of the package structure through the direct bond copper substrate and the heat dissipation device. Moreover, the heat generated by the electronic component can be transferred upwardly to the surroundings of the package structure through the corresponding conductive vias. In comparison with the conventional technology, the heat dissipating efficacy of the package structure of the present invention is largely enhanced. Moreover, since the electronic component is directly embedded within the insulation layer and the conducting terminals of the electronic component are electrically connected with the corresponding conductive patterns, the use life of the package structure is prolonged. Moreover, since an additional electronic component or the heat dissipation device may be installed on an outer surface of the package structure, the integration density of the package structure is increased and the heat dissipating efficacy of the package structure is enhanced. Moreover, since the package structure is mounted on a system circuit board (not shown) by a surface mount technology or through insertions, the applications of the package structure are wider when compared with the conventional technology.

Moreover, in case that the package structure is a multilayered structure comprising a plurality of insulation layers, at least one electronic component is embedded within the corresponding insulation layer. In other words, the electronic components are not arranged on the same layer of the DBC substrate. Since the electronic components are located at different levels with respect to the DBC substrate (i.e. a 3D layout arrangement), the distance between the electronic components of different layers is effectively shortened. Under this circumstance, the on-resistance is effectively reduced, the parasitic effect is reduced, the electrical property is enhanced, and the overall power density of the package structure is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure, comprising:
   a first insulation layer, wherein at least one first conductive via is formed in the first insulation layer;
   a first conductive layer disposed on a top surface of the first insulation layer and in contact with the at least one first conductive via;
   a direct bond copper substrate comprising a second conductive layer, a third conductive layer and a ceramic base, wherein the ceramic base is disposed on a bottom surface of the first insulation layer and exposed to the first insulation layer by a press-fit operation and comprises a first side surface and a second side surface opposite the first side surface exposed to surroundings, the second conductive layer is disposed on a top surface of the ceramic base and embedded within the first insulation layer, and the third conductive layer is disposed on a bottom surface of the ceramic base; and at least one first electronic component embedded within the first insulation layer and attached on the second conductive layer through a fixing material, wherein the first electronic component comprises at least one first conducting terminal, and the at least one first conducting terminal is electrically connected with the second conductive layer and/or electrically connected with the first conductive layer through the at least one first conductive via.

2. The package structure according to claim 1, further comprising a first heat dissipation device located at an outer side of the third conductive layer.

3. The package structure according to claim 1, wherein a length of the third conductive layer in a horizontal direction is shorter than a length of the ceramic base in the horizontal direction, and the third conductive layer is located at a substantially middle region of the bottom surface of the ceramic base.

4. The package structure according to claim 1, wherein the first insulation layer further comprises:
   a third conductive via, wherein a first end of the third conductive via is in contact with the first conductive layer; and
   a conducting structure having a top surface in contact with a second end of the third conductive via and a bottom surface in contact with the second conductive layer, wherein the conducting structure is made of a metallic material.

5. The package structure according to claim 1, wherein the first conductive layer comprises at least one first conductive pattern, the second conductive layer comprises at least one second conductive pattern, and the third conductive layer comprises at least one third conductive pattern.

6. The package structure according to claim 5, wherein the at least one first conductive pattern is in contact with the at least one first conductive via, the at least one first electronic component is disposed on the at least one second conductive pattern, and the at least one second conductive pattern is in contact with the corresponding first conducting terminal of the at least one first electronic component.

7. The package structure according to claim 6, wherein the first electronic component has a top surface and a bottom surface, the first conducting terminal formed on the top surface of the first electronic component is electrically connected with the corresponding first conductive pattern through the corresponding first conductive via, and the first conducting terminal formed on the bottom surface of the first electronic component is disposed on the corresponding second conductive pattern and electrically connected with the corresponding second conductive pattern.

8. The package structure according to claim 5, wherein the first insulation layer further comprises a second conductive via, wherein a first end of the second conductive via is in contact with the corresponding first conductive pattern, and a second end of the second conductive via is in contact with the corresponding second conductive pattern.

9. A package structure, comprising:
   a first insulation layer, wherein at least one first conductive via is formed in the first insulation layer;
   a first conductive layer disposed on a top surface of the first insulation layer and in contact with the at least one first conductive via, wherein the first conductive layer comprises at least one first conductive pattern;
   a direct bond copper substrate comprising a second conductive layer, a third conductive layer and a ceramic base, wherein the ceramic base is disposed on a bottom surface of the first insulation layer and exposed to the first insulation layer by a press-fit operation, the second conductive layer is disposed on a top surface of the ceramic base and embedded within the first insulation layer, and the third conductive layer is disposed on a bottom surface of the ceramic base;
   at least one first electronic component embedded within the first insulation layer and attached on the second conductive layer through a fixing material, wherein the first electronic component comprises at least one first conducting terminal, and the at least one first conducting terminal is electrically connected with the second conductive layer and/or electrically connected with the first conductive layer through the at least one first conductive via; and
   a plurality of pins, wherein the pins are disposed on and in contact with the corresponding first conductive patterns.

10. The package structure according to claim 9, further comprising at least one second electronic component, wherein the second electronic component is disposed on the first conductive layer and arranged between the pins, wherein the second electronic component comprises at least one second conducting terminal, and the second conducting terminal is disposed on the corresponding first conductive pattern.

11. The package structure according to claim 10, wherein the pin comprises:
    an insertion part; and
    a sustaining part, wherein a first end of the sustaining part is disposed on the corresponding first conductive pattern, and a second end of the sustaining part is connected with the insertion part, wherein a width of the sustaining part is larger than a width of the insertion part.

12. The package structure according to claim 11, wherein an overall height of the sustaining part with respect to the first conductive layer is larger than an overall height of the second electronic component with respect to the first conductive layer.

13. The package structure according to claim 9, further comprising:
    a first insulative heat-dissipating layer disposed on the first conductive layer and covering the first conductive layer; and
    a second heat dissipation device located at an outer side of the first insulative heat-dissipating layer for enhancing heat dissipating efficacy of the first conductive layer.

14. The package structure according to claim 13, wherein the pins are disposed on a part of the first conductive layer that is uncovered by the first insulative heat-dissipating layer, wherein the second heat dissipation device is arranged between the pins.

15. A package structure, comprising:
    a first insulation layer, wherein at least one first conductive via is formed in the first insulation layer;
    a first conductive layer disposed on a top surface of the first insulation layer and in contact with the at least one first conductive via, wherein the first conductive layer comprises at least one first conductive pattern;
    a direct bond copper substrate comprising a second conductive layer, a third conductive layer and a ceramic base, wherein the ceramic base is disposed on a bottom surface of the first insulation layer and exposed to the first insulation layer by a press-fit operation, the second conductive layer is disposed on a top surface of the ceramic base and embedded within the first insulation layer, and the third conductive layer is disposed on a bottom surface of the ceramic base;

at least one first electronic component embedded within the first insulation layer and attached on the second conductive layer through a fixing material, wherein the first electronic component comprises at least one first conducting terminal, and the at least one first conducting terminal is electrically connected with the second conductive layer and/or electrically connected with the first conductive layer through the at least one first conductive via;

a second insulation layer disposed on the first conductive layer and covering the first conductive layer, wherein the second insulation layer comprises at least one fourth conductive via;

a fourth conductive layer disposed on a top surface of the second insulation layer and in contact with the at least one fourth conductive via; and a third electronic component embedded within the second insulation layer and attached on the first conductive layer through the fixing material, wherein the third electronic component comprises at least one third conducting terminal, and the at least one third conducting terminal is electrically connected with the first conductive layer and/or electrically connected with the fourth conductive layer through the at least one fourth conductive via.

16. The package structure according to claim 15, wherein the fourth conductive layer comprises at least one fourth conductive pattern, the third electronic component has a top surface and a bottom surface, the third conducting terminal formed on the top surface of the third electronic component is in contact with the corresponding fourth conductive via, and the third conducting terminal formed on the bottom surface of the third electronic component is disposed on the first conductive layer and electrically connected with the first conductive layer.

17. The package structure according to claim 16, wherein the second insulation layer further comprises a fifth conductive via, wherein a first end of the fifth conductive via is in contact with the corresponding fourth conductive pattern, and a second end of the fifth conductive via is in contact with the corresponding first conductive pattern.

18. The package structure according to claim 16, further comprising a plurality of pins, wherein the pins are disposed on and in contact with the corresponding fourth conductive patterns.

19. The package structure according to claim 18, further comprising:

a second insulative heat-dissipating layer disposed on the fourth conductive layer and covering the fourth conductive layer; and a third heat dissipation device located at an outer side of the second insulative heat-dissipating layer for enhancing heat dissipating efficacy of the fourth conductive layer.

20. The package structure according to claim 19, further comprising a metal layer arranged between the second insulative heat-dissipating layer and the third heat dissipation device.

* * * * *